United States Patent
Hook et al.

(10) Patent No.: US 10,121,877 B1
(45) Date of Patent: Nov. 6, 2018

(54) VERTICAL FIELD EFFECT TRANSISTOR WITH METALLIC BOTTOM REGION

(71) Applicant: International Business Machines Corporation, Armonk, NY (US)

(72) Inventors: Terence B. Hook, Jericho, VT (US); Joshua M. Rubin, Albany, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/703,130

(22) Filed: Sep. 13, 2017

(51) Int. Cl.
*H01L 29/66* (2006.01)
*H01L 29/78* (2006.01)
*H01L 29/417* (2006.01)

(52) U.S. Cl.
CPC .. *H01L 29/66666* (2013.01); *H01L 29/41725* (2013.01); *H01L 29/41741* (2013.01); *H01L 29/66787* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 5,612,559 A | 3/1997 | Park et al. | |
| 6,506,638 B1 | 1/2003 | Yu | |
| 7,285,477 B1 | 10/2007 | Bernstein et al. | |
| 7,402,866 B2 | 6/2008 | Liang et al. | |
| 7,446,025 B2 | 11/2008 | Cohen et al. | |
| 7,683,428 B2 | 3/2010 | Chidambarrao et al. | |
| 8,284,211 B2 | 10/2012 | Yang et al. | |
| 8,716,091 B2 | 5/2014 | Cohen et al. | |
| 9,269,713 B2 | 2/2016 | Irsigler et al. | |
| 2006/0125025 A1 | 6/2006 | Kawashima et al. | |
| 2008/0054313 A1 | 3/2008 | Dyer et al. | |
| 2008/0206977 A1 | 8/2008 | Frank et al. | |
| 2010/0082132 A1 | 4/2010 | Marruchella et al. | |
| 2012/0052635 A1 | 3/2012 | Kang et al. | |
| 2015/0318213 A1* | 11/2015 | Tsai | H01L 29/42376 257/9 |
| 2016/0181362 A1* | 6/2016 | Yang | H01L 29/0649 257/329 |

OTHER PUBLICATIONS

Wang, Wei-Che, and Puneet Gupta. "Efficient Layout Generation and Evaluation of Vertical Channel Devices." 2014 IEEE/ACM International Conference on Computer-Aided Design (ICCAD), 2014, doi:10.1109/iccad.2014.7001404.*

* cited by examiner

*Primary Examiner* — Joseph Schoenholtz
(74) *Attorney, Agent, or Firm* — Cantor Colburn LLP; Vazken Alexanian (57) ABSTRACT

A method for fabricating a semiconductor device includes forming a semiconductor fin over a substrate. A first doped region is formed on a first end of the semiconductor fin. A second doped region is formed on a second end of the semiconductor fin. An extended contact is formed on the second doped region. A portion of the extended contact extends past an end of the semiconductor fin in a direction orthogonal to a channel of the semiconductor fin. A contact extension is formed on the portion of the extended contact extending past the end of the semiconductor fin. A contact is formed on the first doped region.

18 Claims, 10 Drawing Sheets

VERTICAL FIELD EFFECT TRANSISTOR WITH METALLIC BOTTOM REGION

BACKGROUND

The present invention generally relates to fabrication methods and resulting structures for semiconductor devices. More specifically, the present invention relates to vertical field effect transistors (FETs) with a metallic bottom region.

In contemporary semiconductor device fabrication processes, a large number of semiconductor devices, such as FETs, are fabricated on a single wafer. Some non-planar transistor architectures, such as vertical FETs (VFETs), employ semiconductor fins and side-gates that can be contacted outside the active region, resulting in increased device density and some increased performance over lateral devices. In VFETs the source to drain current flows in a direction that is perpendicular, i.e., orthogonal, to a major surface of the substrate. For example, in a known VFET configuration a major substrate surface is horizontal and a vertical semiconductor fin or nanowire extends upward from the substrate surface. The semiconductor fin or nanowire forms the channel region of the transistor. A source region and a drain region are situated in electrical contact with the top and bottom ends of the channel region, while the gate is disposed on one or more of the semiconductor fin or nanowire sidewalls.

SUMMARY

Embodiments of the present invention are directed to a method of fabricating a semiconductor device. A non-limiting example of the method includes forming a semiconductor fin over a substrate. The method includes forming a first doped region on a first end of the semiconductor fin. The method includes forming a second source/drain region on a second end of the semiconductor fin. The method includes forming an extended contact on the second doped region. A portion of the extended contact extends past an end of the semiconductor fin in a direction orthogonal to a channel of the semiconductor fin. The method includes forming a contact extension on the portion of the extended contact extending past the end of the semiconductor fin. The method includes forming a contact on the first doped region.

Embodiments of the present invention are directed to a method for fabricating a semiconductor device. A non-limiting example of the method includes forming an etch stop layer over a substrate. The method includes forming a semiconductor fin over the etch stop layer. The method includes forming a first doped region on a first end of the semiconductor fin. The method includes forming a second doped region on a second end of the semiconductor fin. The method includes forming an extended contact on the second doped region and contacting the etch stop layer. The method includes forming a contact extension on the extended contact and through the etch stop layer. The method includes forming a contact on a first doped region.

Embodiments of the present invention are directed to a semiconductor device. A non-limiting example of the semiconductor device includes a first end of a first doped region on a first end of the semiconductor fin. The semiconductor device includes an etch stop layer on a second end of the first doped region. The semiconductor device includes a second doped region on a second end of a semiconductor fin. The semiconductor device includes an extended contact on the second doped region and contacting the etch stop layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. There are challenges, however, in providing VFETs with equal or superior performance characteristics to lateral devices. For example, one of the drawbacks of conventional VFETs is the relatively high resistance of the bottom source/drain (S/D).

In a conventional VFET, a bottom S/D contact is formed from the top of the VFET on a portion of the bottom S/D region adjacent to the semiconductor fin. The bottom S/D contact is spaced apart from the semiconductor fin in a direction orthogonal to the channel of the VFET. Accordingly, the bottom S/D region must conduct current in a direction parallel to a major surface of the substrate, i.e., laterally, to the bottom S/D contact. Reducing the resistance of the bottom S/D region is challenging. The bottom S/D region is formed before the other features of the VFET and is typically limited to semiconductor material or silicide, as forming the bottom S/D region from a metallic material prior to forming the other device elements is difficult. Semiconductor material or silicide has a relatively high resistance, which compromises device performance.

Turning now to an overview of the aspects of the invention, one or more embodiments of the invention address the above-described shortcomings of the prior art by providing methods and structures configured to reduce resistance in a bottom region of a VFET. The VFET includes a first doped or S/D region and a second doped or S/D region, which are on opposite ends of a semiconductor fin formed over a substrate. An extended S/D contact is formed on the second doped or S/D region. A portion of the extended S/D contact extends past the semiconductor fin in a direction orthogonal to the channel. A wafer is bonded to the extended S/D contact, the VFET is inverted, and S/D and gate contacts are deposited. Once inverted, the first doped or S/D region defines a "top" S/D region of the VFET and the second doped or S/D region defines a "bottom" S/D region of the VFET.

The above-described aspects of the invention address the shortcomings of the prior art by providing a VFET with a bottom region (i.e., the second doped or S/D region) that can include metal, i.e., a metallic bottom region. In particular, the extended S/D contact can include metal. The metallic bottom region has a lower resistance than conventional semiconductor or silicide-based bottom S/D regions, and device performance is improved. Moreover, the first doped or S/D region (i.e., the "bottom" S/D region prior to inverting the VFET) can have a thickness of less than about 30 nm, for example, about 10 nm. In contrast, the bottom S/D region of a conventional VFET, which is required to conduct current laterally, must be formed with a thickness of, for example, 30 nm or greater, due to the relatively high resistance of the semiconductor material or silicide from which conventional bottom S/D regions are formed.

Figure 1:
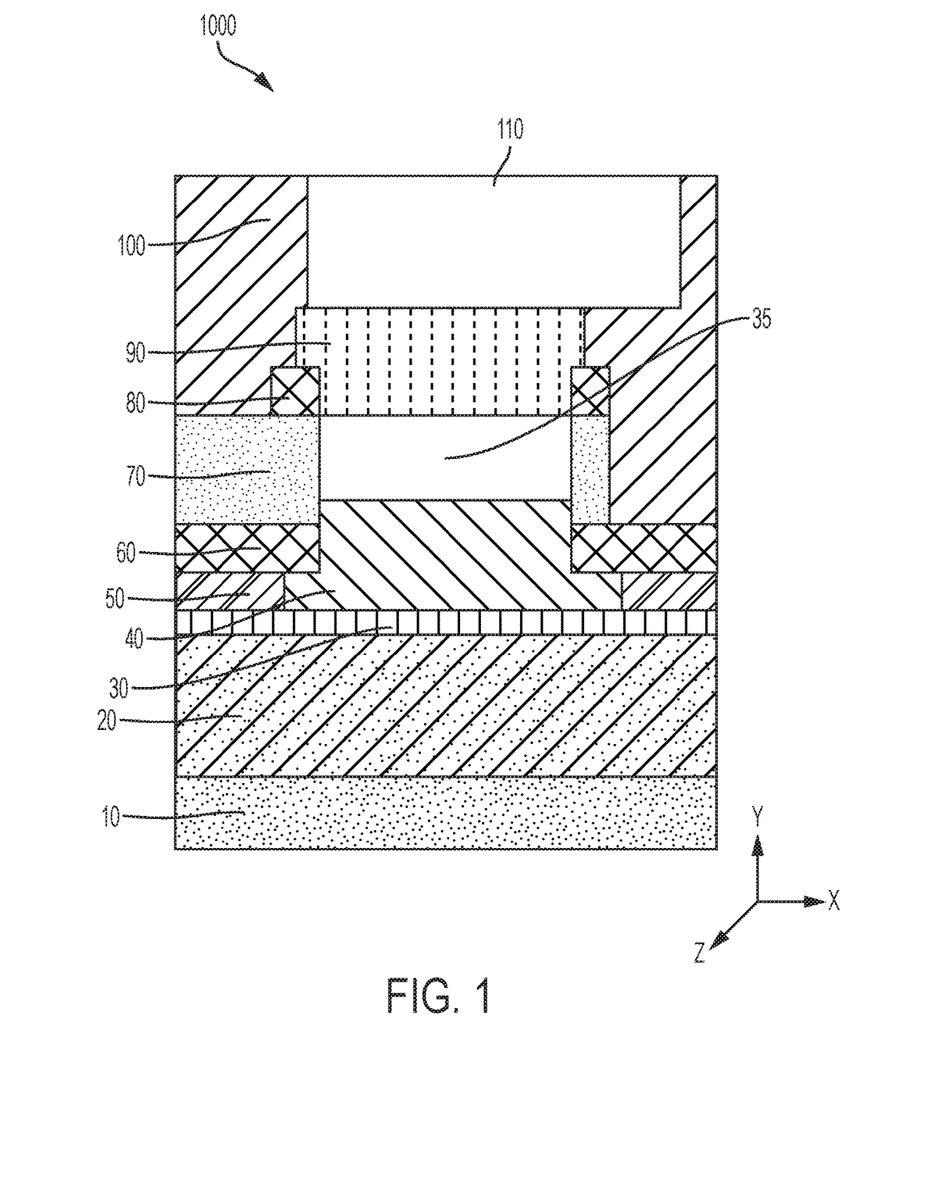
FIG. 1 depicts a cross-sectional view of a semiconductor structure after a processing operation according to one or more embodiments of the present invention.

Turning now to a more detailed description of aspects of the present invention, FIGS. 1-8 depict cross-sectional and plan views after various operations of a method of fabricating a semiconductor device according to one or more embodiments of the invention. As depicted in FIG. 1, a partially fabricated semiconductor device 1000 can include a vertical semiconductor fin 35 (hereinafter semiconductor fin 35) formed over a substrate 10. The semiconductor fin 35 can have a height ranging from about 1 nanometer (nm) to about 150 nm. For example, in some embodiments of the invention, the semiconductor fin 35 can have a height ranging from about 10 nm to about 50 nm. The semiconductor fin 35 can have a width ranging from about 5 nm to about 40 nm. For example, in some embodiments of the invention, the semiconductor fin 35 can have a width ranging from about 10 nm to about 20 nm. Adjacent semiconductor fins (not depicted) can be separated by a pitch ranging from about 20 nm to about 100 nm, for example, from about 30 nm to about 50 nm.

The substrate 10 can be any suitable substrate material, such as, for example, monocrystalline Si, SiGe, SiC, III-V compound semiconductor, II-VI compound semiconductor, or semiconductor-on-insulator (SOI). In some embodiments, the substrate 10 includes a buried oxide (BOX) layer 20.

An optional etch stop layer 30 can be formed over the substrate 10. The etch stop layer 30 can include a dielectric material, such as one or more of silicon oxide, silicon nitride ($Si_3N_4$), and silicon oxynitride, and can be formed using known deposition processes.

Figure 7:
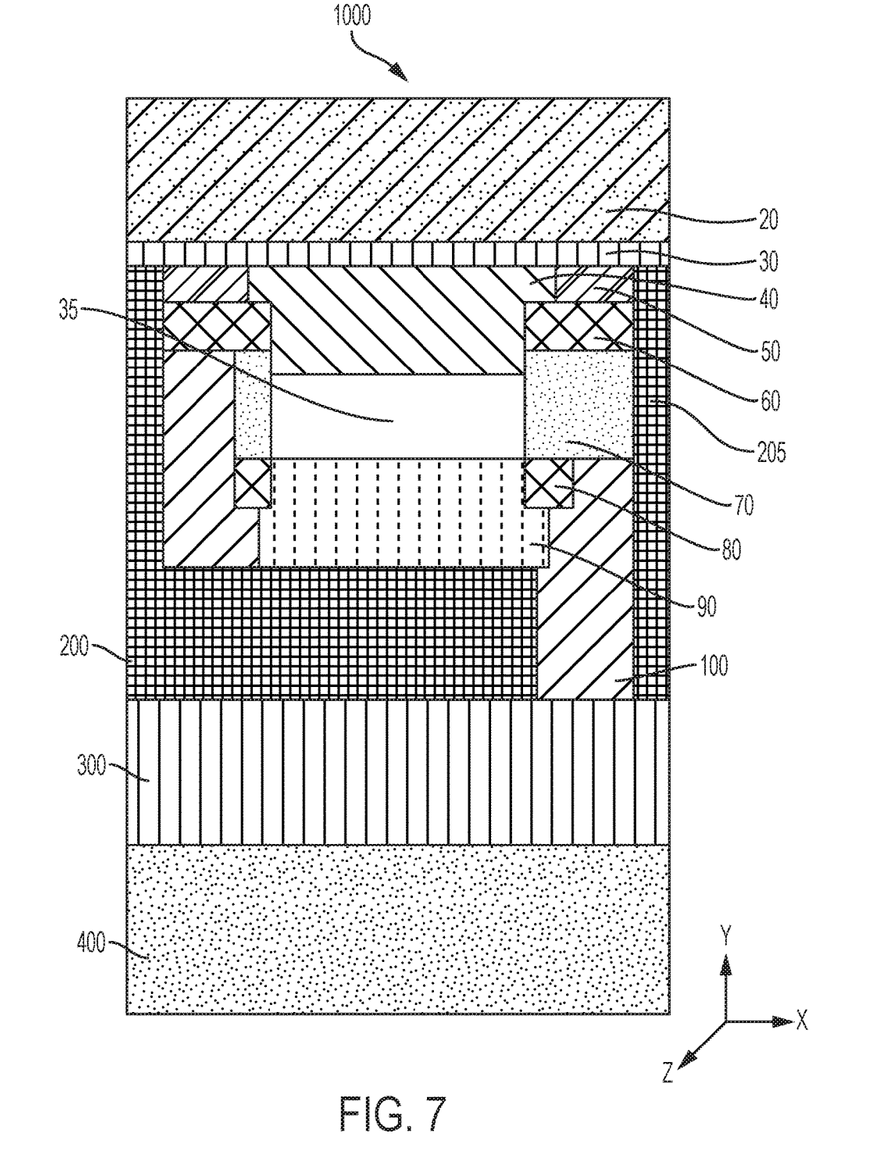
FIG. 7 depicts a cross-sectional view of the semiconductor structure after a processing operation according to one or more embodiments of the present invention.

A first S/D region 40, e.g., a "top" S/D region after flipping the VFET (as depicted in FIG. 7), can be formed by a variety of methods, such as, for example, in-situ doped epitaxy, doped following the epitaxy, or by implantation and plasma doping. The first S/D region 40 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, the first S/D region 40 includes epitaxial semiconductor materials grown from gaseous or liquid precursors. In some embodiments, epitaxial regions are epitaxially grown over the substrate 10. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al), depending on the type of transistor. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$ In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions include silicon. In some embodiments, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

In some embodiments, the semiconductor fin 35 is formed over the first S/D region 40 using known lithographic processes. The lithographic step can include applying a photoresist layer (not depicted), exposing the photoresist layer to a desired pattern of radiation, and developing the exposed photoresist layer utilizing a resist developer. The etching process can include dry etching and/or wet chemical etching. Examples of dry etching processes that can be used include reactive ion etching (RIE), ion beam etching, plasma etching or laser ablation. In some embodiments, the BOX layer 20 or the etch stop layer 30 serves as an etch stop. After forming the semiconductor fin 35, the patterned photoresist layer can be removed utilizing a resist stripping process such as, for example, ashing. In some embodiments, the semiconductor fin 35 is formed utilizing a sidewall image transfer (SIT) process.

The semiconductor fin 35 can be electrically isolated by a shallow trench isolation (STI) 50. The STI 50 can be of any suitable dielectric material, such as, for example, a silicon oxide. Any known manner of forming the STI 50 can be utilized. In some embodiments, the STI 50 is formed by etching back the first S/D region 40 to form a trench, depositing the STI 50 material in the trench, and planarizing to a surface of the first S/D region 40 using, for example, a chemical-mechanical planarization (CMP) process.

A spacer 60 is formed on the first S/D region 40 and the STI 50. The spacer 60 can include a dielectric material, such as one or more of silicon oxide, silicon nitride, and silicon oxynitride, and can be formed using known deposition processes.

In some embodiments, the spacer 60 is formed by performing a directional deposition process such as, for example, a Gas Cluster Ion Beam (GCIB) process. The GCIB process is a deposition process that can be highly directional in nature. For example, the directional deposition process can result in the deposition of dielectric material on the horizontally oriented surfaces of the semiconductor device 1000, such as the upper surface of the first S/D region 40, while avoiding deposition of any substantial amount of dielectric material on the vertically-oriented surfaces of the semiconductor device 1000, such as sidewalls of the semiconductor fin 35.

A conductive gate 70 can be formed by, for example, deposition, over channel regions (i.e., sidewalls) of the semiconductor fin 35. The conductive gate 70 can be made of any suitable gate material, such as, for example, a high dielectric constant material having a dielectric constant greater than silicon dioxide. Exemplary high dielectric constant material include, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof, where each value of x is independently from 0.5 to 3 and each value of y is independently from 0 to 2.

A spacer 80 can be formed over the conductive gate 70. The spacer 80 can include a dielectric material, such as one or more of silicon oxide, silicon nitride, and silicon oxynitride, and can be formed using a deposition process such as, for example, GCIB. In some embodiments, the spacer 80 can include a same material as the spacer 60.

A second S/D region 90, e.g., a "bottom" S/D region after flipping the VFET (as depicted in FIG. 7), is formed on an exposed portion of the semiconductor fin 35. The second S/D region 90 can be an epitaxial silicon layer epitaxially grown using known processes. Epitaxial materials can be grown from gaseous or liquid precursors. Epitaxial materials can be grown using, for example, vapor-phase epitaxy (VPE), molecular-beam epitaxy (MBE), or liquid-phase epitaxy (LPE). Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the second S/D region 90 can range from about $1 \times 10^{19}$ $cm^{-3}$ to about $2 \times 10^{21}$ $cm^{-3}$, for example, between about $2 \times 10^{20}$ $cm^{-3}$ to about $1 \times 10^{21}$ $cm^{-3}$. In some embodiments of the invention, the gas source for the deposition of epitaxial semiconductor materials can include a silicon containing gas source, a germanium containing gas source, or a combination thereof. The first S/D region 40 and the second S/D region 90 are spaced apart, for example, in a Y-direction of the semiconductor device 1000.

A dielectric material 100 is deposited over the semiconductor device 1000. The dielectric material 100 can be any suitable dielectric material, such as, for example, a silicon oxide. In some embodiments of the invention, the dielectric material 100 includes a low temperature oxide (LTO).

As depicted in FIG. 1, the dielectric material 100 is etched to expose a surface of the second S/D region 90. Etching of the dielectric material 100 to expose the second S/D region 90 forms a trench 110. In some embodiments of the invention, the dielectric material 100 is etched by a reactive ion etch (RIE).

Figure 2:
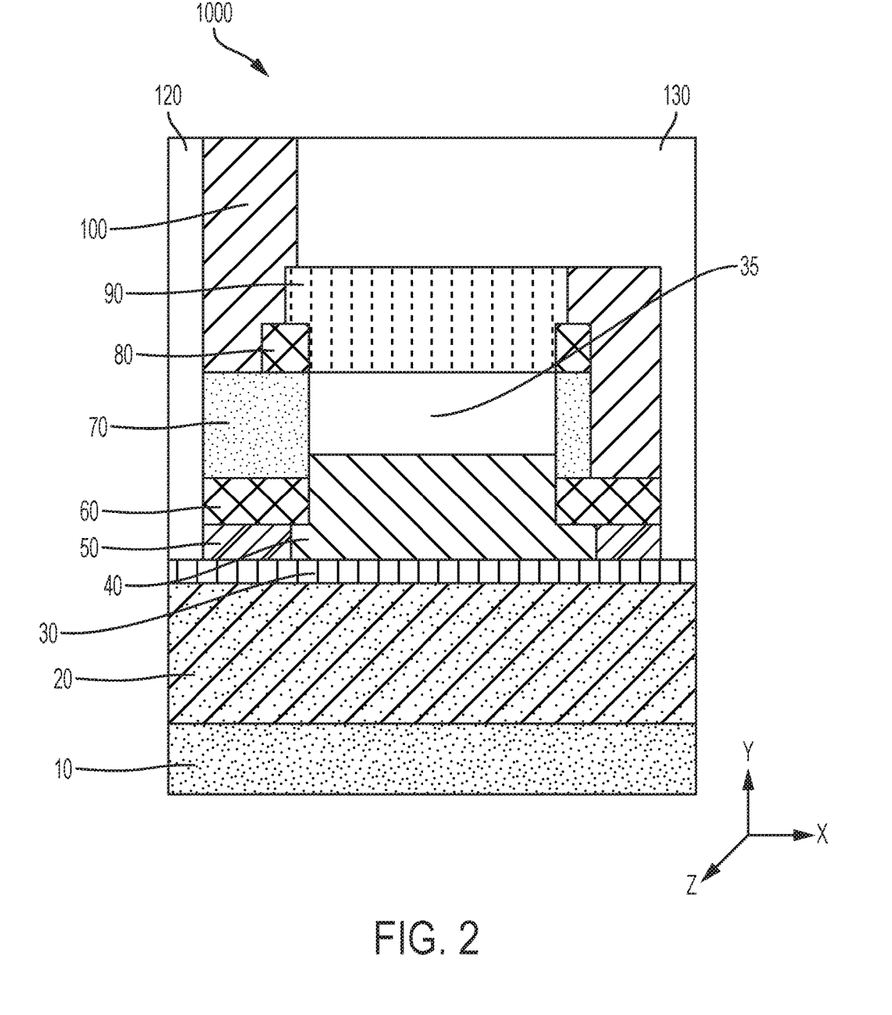
FIG. 2 depicts a cross-sectional view of a semiconductor structure after a processing operation according to one or more embodiments of the present invention.

FIG. 2 depicts a cross-sectional view of a VFET structure after an intermediate operation of the exemplary method of fabricating a semiconductor device 1000 according to one or more embodiments of the invention. As depicted in FIG. 2, dielectric material 100, gate 70, spacer 60, and STI 50 are etched to etch stop layer 30 forming a trench 120, e.g., a gate trench. Additionally, dielectric material 100, spacer 60, and STI 50 are etched to etch stop layer 30 also forming a trench 130, which includes the trench 110. In some embodiments of the invention, the etching is a ME.

Figure 3:
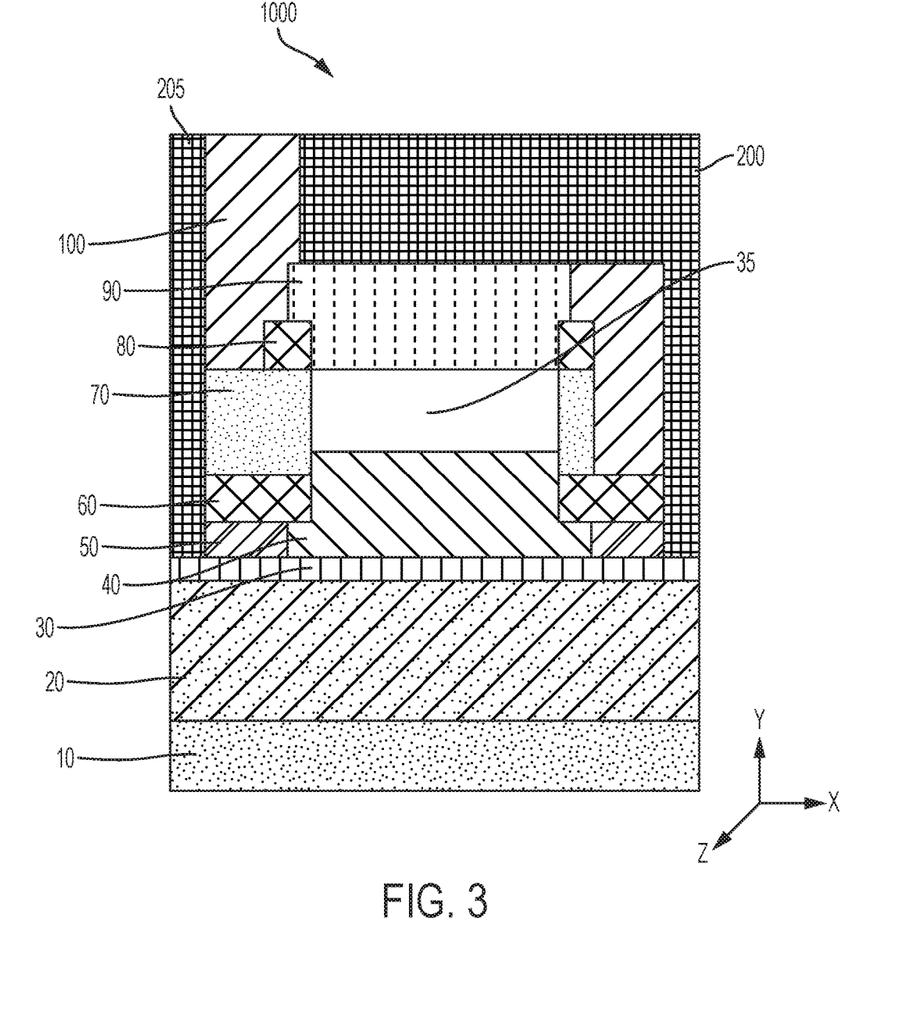
FIG. 3 depicts a cross-sectional view of the semiconductor structure after a processing operation according to one or more embodiments of the present invention.

FIG. 3 depicts a cross-sectional view of a VFET structure after an intermediate operation of the exemplary method of fabricating a semiconductor device 1000 according to one or more embodiments of the invention. As depicted in FIG. 3, a conducting material is deposited into the trenches 120, 130, forming an extended S/D contact 200 and a gate contact 205. The extended S/D contact 200 contacts the second S/D region 90 and contacts the etch stop layer 30.

The extended S/D contact 200 and gate contact 205 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), or any suitable combination of these materials. In some embodiments, each of the extended S/D contact 200 and gate contact 205 includes one or more of cobalt, tungsten, and copper. In some embodiments of the invention, the conducting material is deposited using, for example, CVD. In some embodiments, the conducting material is overfilled into the trenches 120, 130, forming overburdens above a surface of the dielectric material 100. In some embodiments, a CMP selective to the dielectric material 100 removes the overburden.

Figure 4:
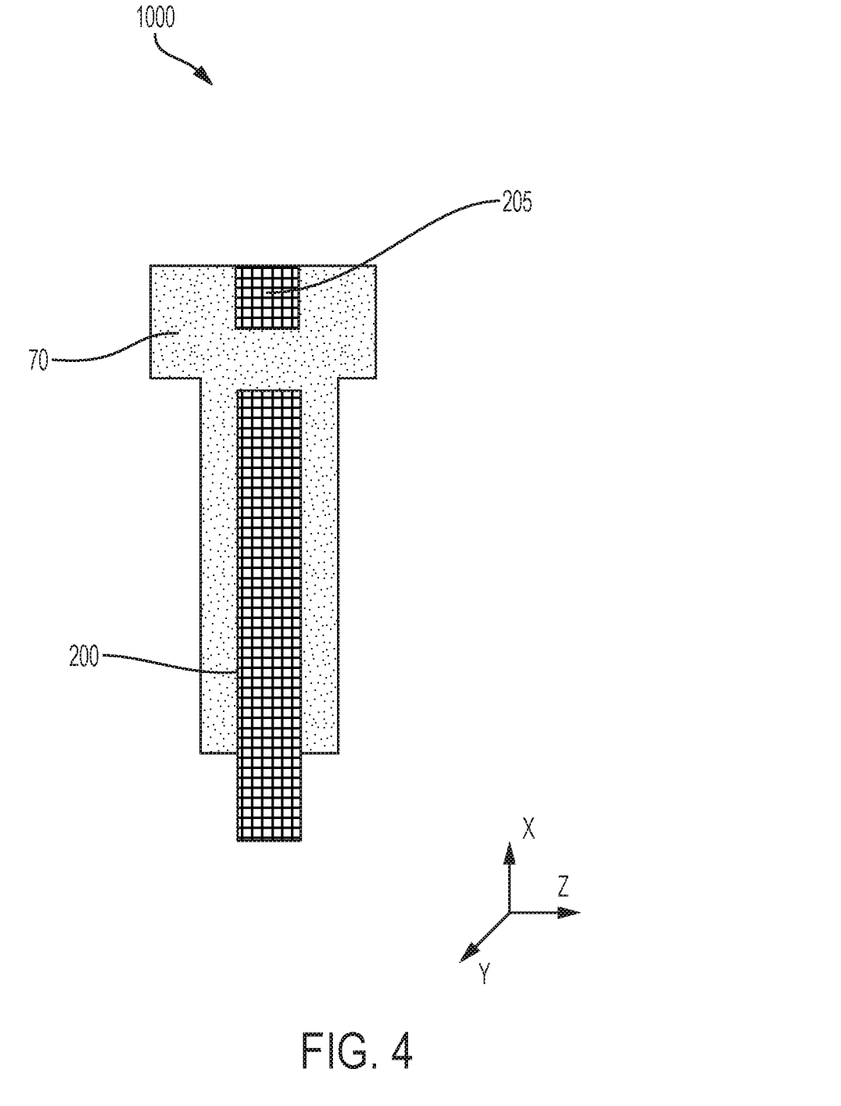
FIG. 4 depicts a relative relationship of features of the semiconductor structure shown in FIG. 3 according to one or more embodiments of the present invention.

FIG. 4 depicts a modified top-down view of the semiconductor device 1000 shown in FIG. 3 according to one or more embodiments of the invention. As depicted in FIG. 4, the extended S/D contact 200 extends beyond the gate 70 in a direction, e.g., X-direction, orthogonal to the Y-direction of the semiconductor device 1000. FIG. 4 depicts a layout in which the extended S/D contact 200 and the gate 70 are simultaneously visible, as is readily understood by one of ordinary skill in the art, rather than depicting a true top-down view or a cross-sectional view. Stated otherwise, FIG. 4 depicts a cross-sectional top-down view of the extended S/D contact 200 superimposed on a cross-sectional top-down view of the gate 70 to better illustrate features that would otherwise be obscured by the extended S/D contact 200. The depicted shape of the extended S/D contact 200 is not coplanar with the depicted shape of the gate 70.

Figure 5:
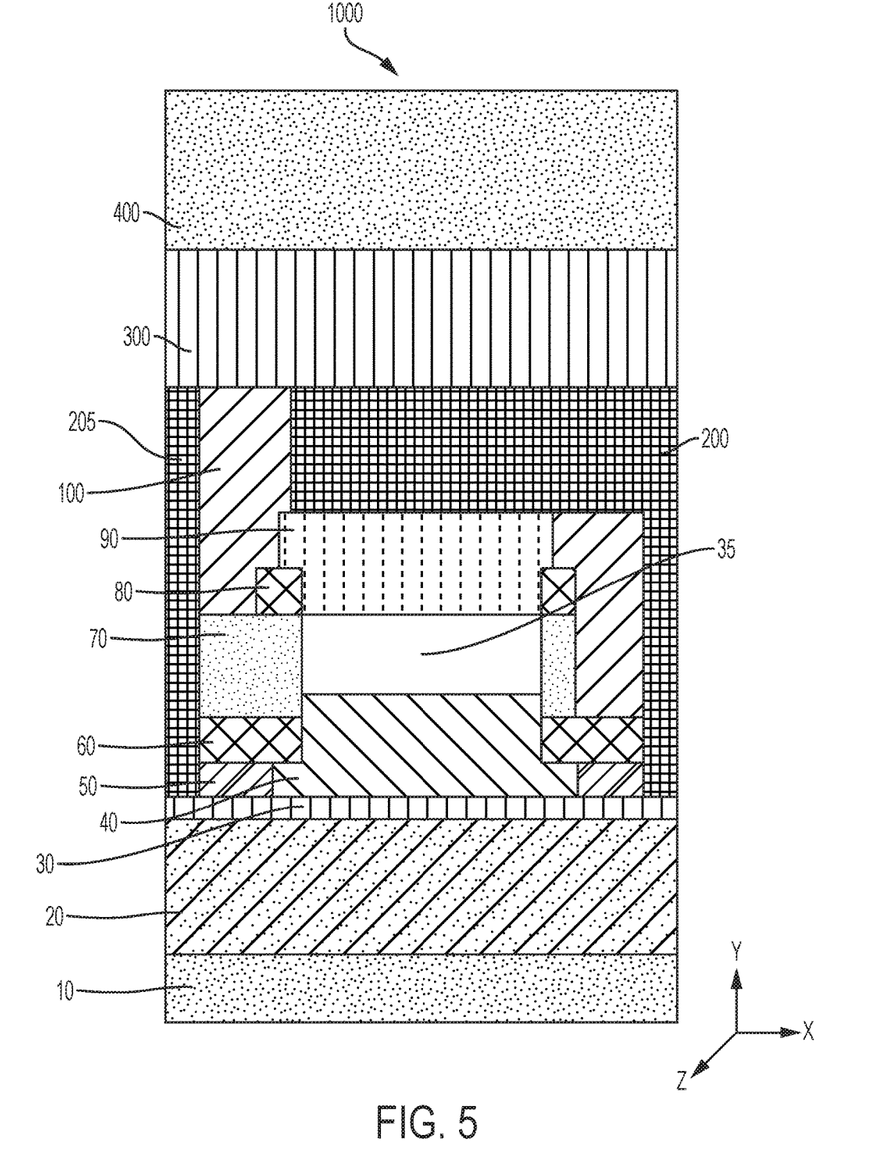
FIG. 5 depicts a cross-sectional view of the semiconductor structure after a processing operation according to one or more embodiments of the present invention.

FIG. 5 depicts a cross-sectional view of a VFET structure after an intermediate operation of the exemplary method of fabricating a semiconductor device 1000 according to one or more embodiments of the invention. As depicted in FIG. 5, a bonding oxide 300 is deposited on a surface of the semiconductor device 1000, e.g., a surface including the extended S/D contact 200, the gate contact 205, and the dielectric material 100. A handle wafer 400 is deposited on the bonding oxide. In some embodiments of the invention, the handle wafer 400 is deposited on the surface of the semiconductor device 1000 including the extended S/D contact 200, the gate contact 205, and the dielectric material 100.

Figure 6:
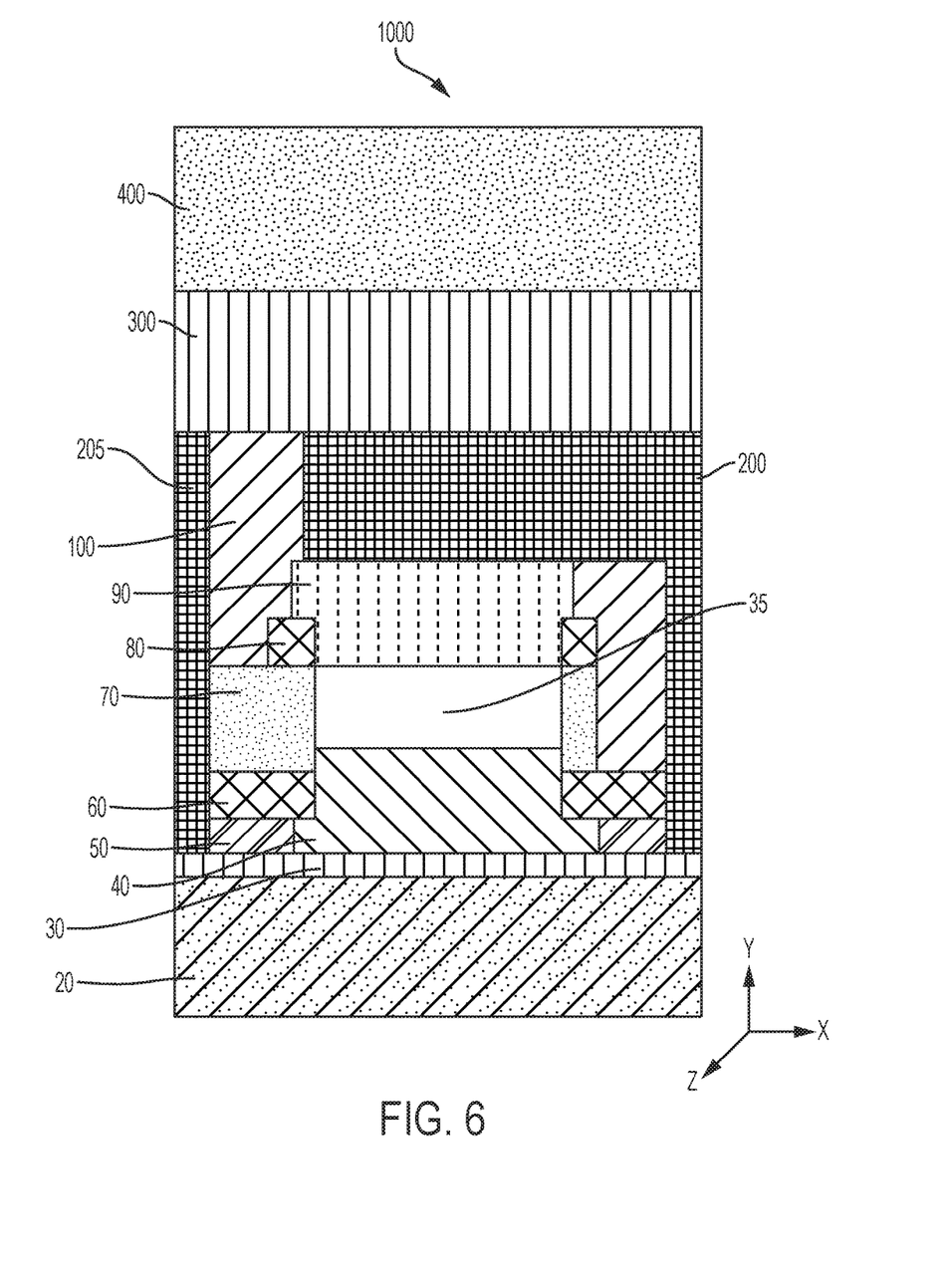
FIG. 6 depicts a cross-sectional view of the semiconductor structure after a processing operation according to one or more embodiments of the present invention.

FIG. 6 depicts a cross-sectional view of a VFET structure after an intermediate operation of the exemplary method of fabricating a semiconductor device 1000 according to one or more embodiments of the invention. As depicted in FIG. 6, substrate 10 is removed, e.g., by a RIE or other etching process, from the semiconductor device 1000. Removal of the substrate 10 is controlled so as to minimize or prevent removal of the first S/D region 40, for example, in embodiments in which the semiconductor device 1000 does not include the BOX layer 20 and/or the etch stop layer 30. In some embodiments of the invention, for example, in embodiments in which the semiconductor device 1000 does not include the BOX layer 20 and/or the etch stop layer 30, following removal of the substrate 10, a dielectric material (not depicted) is deposited on the surface exposed by the substrate 10 removal.

FIG. 7 depicts a cross-sectional view of a VFET structure after an intermediate operation of the exemplary method of fabricating a semiconductor device 1000 according to one or more embodiments of the invention. As depicted in FIG. 7, the semiconductor device 1000 is turned, e.g., flipped or inverted. Accordingly, the second S/D region 90 now defines a "bottom" S/D region and the first S/D region 40 now defines a "top" S/D region. In some embodiments of the invention the BOX layer 20 is etched, e.g., thinned, for example, by a RIE.

Figure 8:
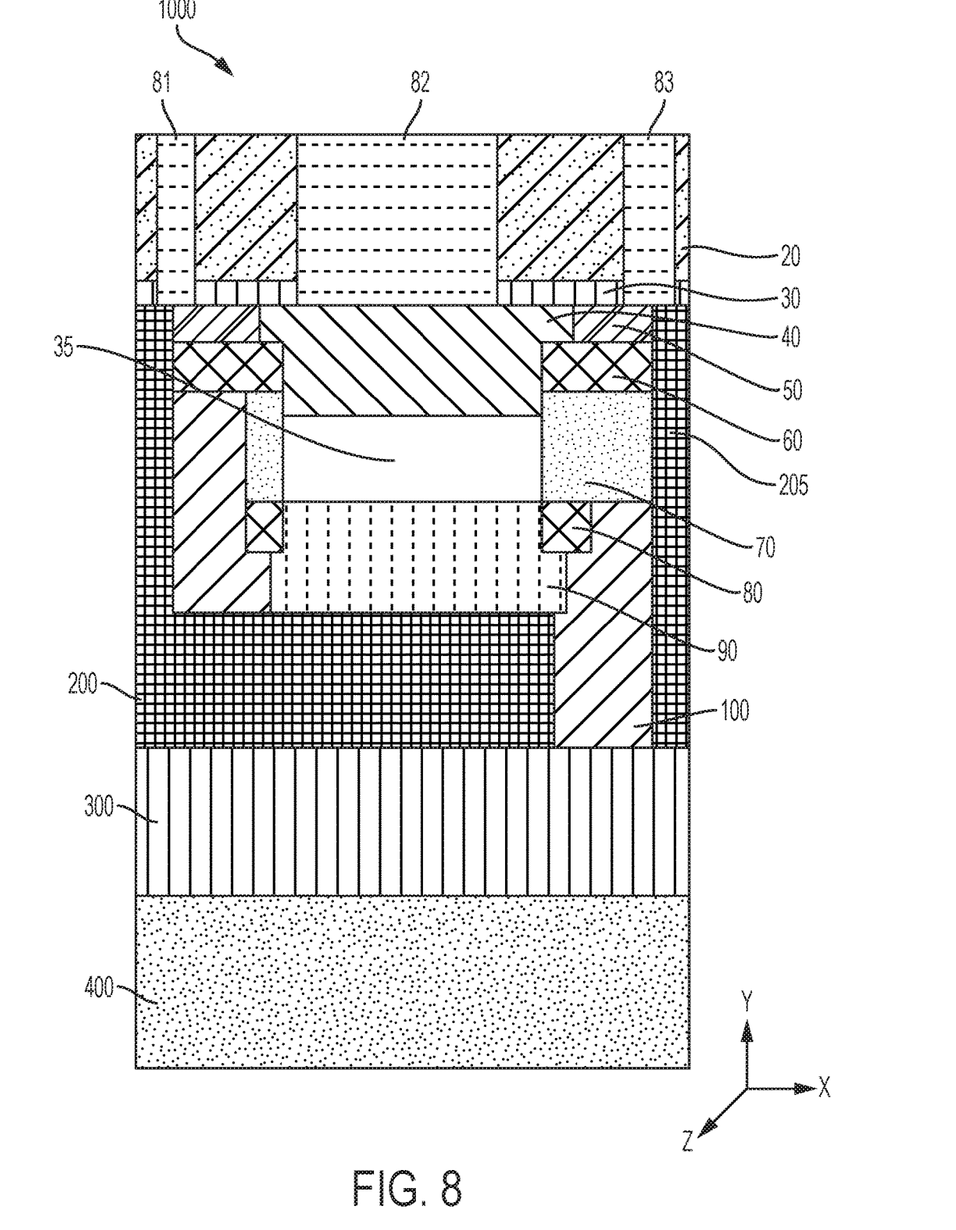
FIG. 8 depicts a cross-sectional view of the semiconductor structure after a processing operation according to one or more embodiments of the present invention.

FIG. 8 depicts a cross-sectional view of a VFET structure after an intermediate operation of the exemplary method of fabricating a semiconductor device 1000 according to one or more embodiments of the invention. As depicted in FIG. 8, portions of the BOX layer 20 are etched to the etch stop layer 30. Exposed portions of the etch stop layer 30 are then etched, forming trenches (not depicted). A conducting material is deposited in the trenches. In some embodiments of the invention, the etching process is a RIE and the conductive material is deposited using CVD. The trenches with the conducting material deposited therein form a bottom S/D contact extension 81 on a surface of the extended S/D contact 200, a top contact 82 on a surface of the first S/D region 40, and a gate contact extension 83 on a surface of the gate contact 205. The bottom S/D contact extension 81, top contact 82 to the first S/D region 40, and gate contact extension 83 can be formed using known metallization techniques, and can be made of a similar material as the extended S/D contact 200 and gate contact 205.

In the semiconductor device 1000 depicted in FIG. 8, current is conducted laterally through the extended S/D contact 200. As the extended S/D contact 200 is metallic, it has a lower resistance than a laterally conducting bottom region including, for example, semiconductor material or silicide. The first S/D region 40 is not required to conduct current laterally. Therefore, in some embodiments of the invention, the first S/D region 40, which is formed before other features of the semiconductor device 1000 such as the gate 70 and the second S/D region 90, is formed to have a thickness of less than about 30 nm, for example, about 10 nm. In contrast, when the first S/D region 40 of a VFET is required to conduct current laterally (i.e., as is required in a conventional VFET where the first S/D region 40 defines a "bottom" S/D region), the first S/D region 40 must be formed with a thickness of, for example, 30 nm or greater, due to the relatively high resistance of the semiconductor material or silicide from which the first S/D region 40 is formed.

In some embodiments of the invention, there is some degree of misregistration or misalignment between the bottom S/D contact extension 81 and the extended S/D contact 200, the top contact 82 and the first S/D region 40, and/or the gate contact extension 83 and the gate contact 205. However, misalignment results in formation of a portion of the bottom S/D contact extension 81, the top contact 82, or the gate contact extension 83 on STI 50, a dielectric material. Accordingly, the misalignment will not short the semiconductor device 1000.

Figure 9:
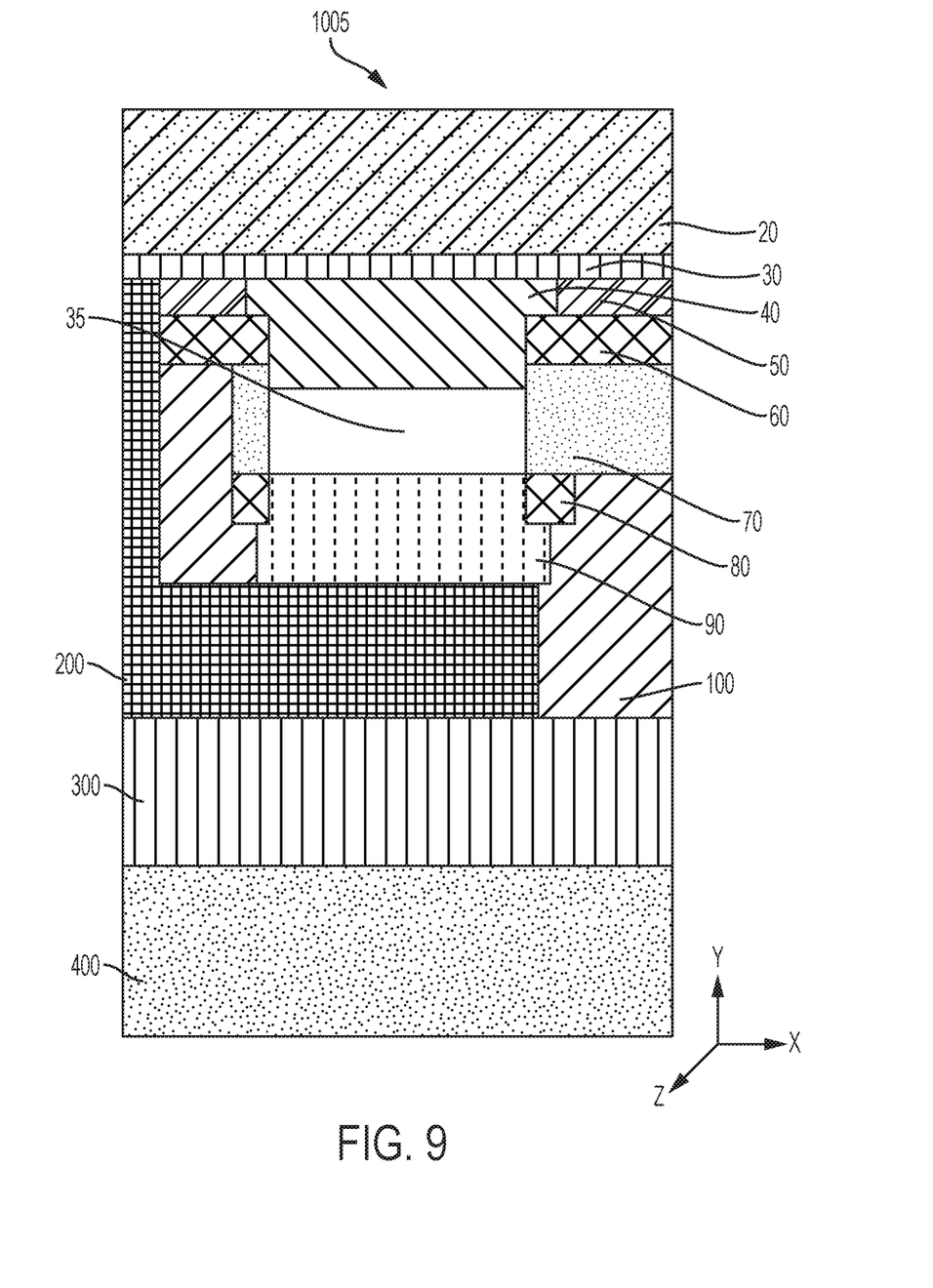
FIG. 9 depicts a cross-sectional view of a semiconductor structure after a processing operation according to one or more embodiments of the present invention.

FIG. 9 depicts a cross-sectional view of a VFET structure after an intermediate operation of the exemplary method of fabricating a semiconductor device 1005 according to one or more embodiments of the invention. As depicted in FIG. 9, in semiconductor device 1005, gate contact 205 is not formed, as described above, with reference to FIGS. 3-8.

Figure 10:
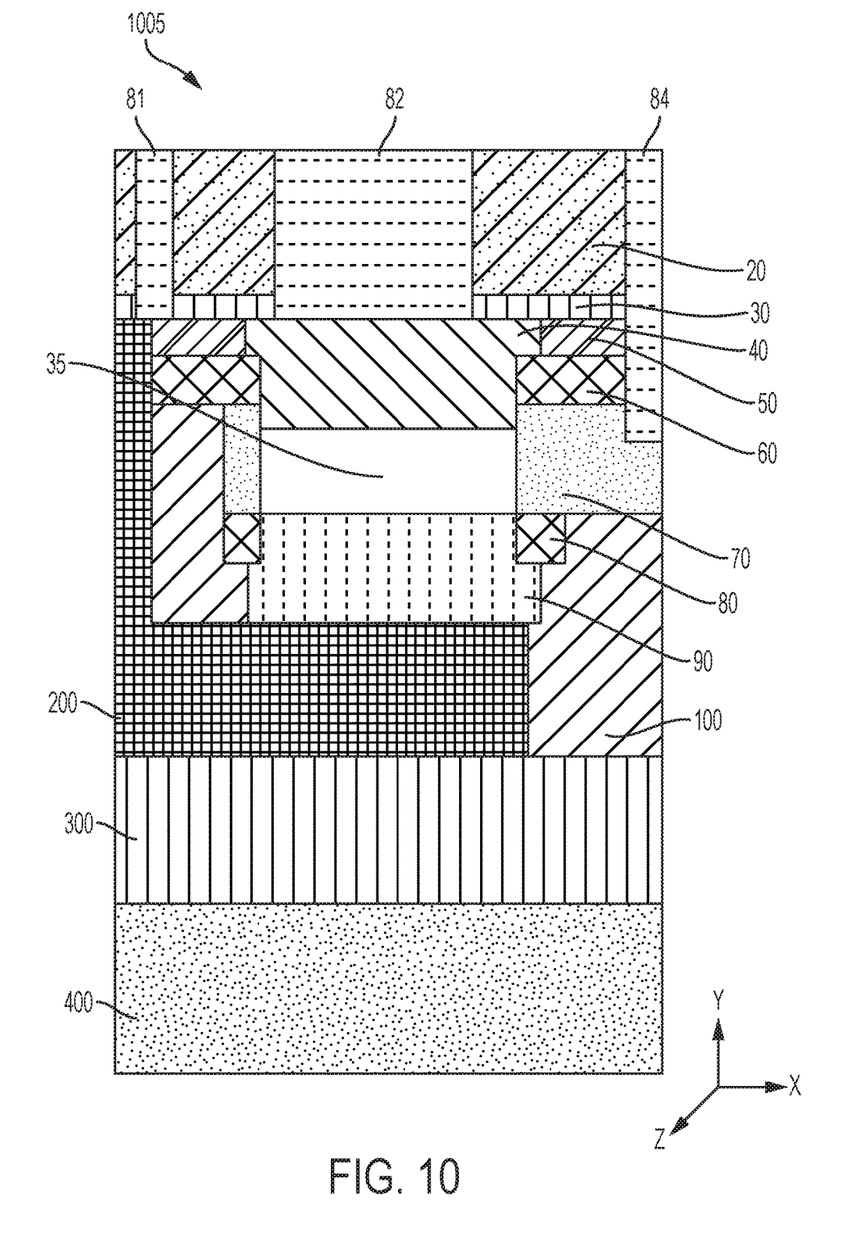
FIG. 10 depicts a cross-sectional view of the semiconductor structure after a processing operation according to one or more embodiments of the present invention.

FIG. 10 depicts a cross-sectional view of a VFET structure after an intermediate operation of the exemplary method of fabricating a semiconductor device 1005 according to one or more embodiments of the invention. As depicted in FIG. 10, in the semiconductor device 1005, a gate contact 84 is formed by depositing a contact material in a trench formed by etching the BOX layer 20, the etch stop layer 30, the first S/D region 40, the spacer 60, and a portion of the gate 70. In some embodiments of the invention, the contact material is, for example, one or more of cobalt, tungsten, and copper. In some embodiments of the invention, the contact material is deposited in trenches 120, 130 using CVD.

In some embodiments of the invention, the gate contact 84 does not extend to the bonding oxide 300 in the Y-direction. In some embodiments of the invention, the gate contact 84 does not extend past the gate 70 in the Y-direction. Accordingly, a distance between the gate contact 84 and the extended S/D contact 200 is increased or maximized, and capacitance between the gate contact 84 and the extended S/D contact 200 is reduced or prevented. In some embodiments of the invention, the extended S/D contact 200 and the gate contact 84 are formed in separate steps, and interactions between the gate 70 and the second S/D region 90 are reduced or minimized.

As previously described herein with reference to FIG. 8, current is conducted laterally through the extended S/D contact 200. As the extended S/D contact 200 is metallic, it has a lower resistance than a laterally conducting bottom region including, for example, semiconductor material or silicide. The first S/D region 40 is not required to conduct current laterally. Therefore, in some embodiments of the invention, the first S/D region 40, which is formed before other features of the semiconductor device 1005 such as the gate 70 and the second S/D region 90, is formed to have a thickness of less than about 30 nm, for example, about 10 nm. In contrast, when an S/D region of a VFET including semiconductor material or silicide is required to conduct current laterally, the S/D region including semiconductor material or silicide must be formed with a thickness of, for example, 30 nm or greater, due to the relatively high resistance of the semiconductor material or silicide. In some embodiments of the invention, there is some degree of misregistration or misalignment between the bottom S/D contact extension 81 and the extended S/D contact 200 and/or the top contact 82 and the first S/D region 40.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), CVD, electrochemical deposition (ECD), molecular beam epitaxy (MBE) and more recently, atomic layer deposition (ALD) among others. Removal/etching is any process that removes material from the wafer. Examples include etch processes (either wet or dry), and CMP, and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for fabricating a semiconductor device, the method comprising:
   forming a semiconductor fin over a substrate;
   forming a first doped region on a first end of the semiconductor fin;
   forming a second doped region on a second end of the semiconductor fin;
   forming an extended contact on the second doped region, a portion of the extended contact extending past an end of the semiconductor fin in a direction orthogonal to a channel of the semiconductor fin;
   forming a contact extension on the portion of the extended contact extending past the end of the semiconductor fin; and
   forming a contact on the first doped region, wherein each of the extended contact, the contact on the first doped region, and the contact extension comprises metal.

2. The method of claim 1 further comprising removing the substrate prior to forming the contact extension on the portion of the extended contact extending past the end of the semiconductor fin.

3. The method of claim 1, wherein each of the extended contact, the contact on the first doped region, and the contact extension comprises one or more of cobalt, tungsten, and copper.

4. The method of claim 1, wherein forming each of the contact on the first doped region and the contact extension comprises etching through a dielectric material.

5. The method of claim 4, wherein forming the contact extension comprises depositing the metal in a first trench formed by etching through the dielectric.

6. The method of claim 4 further comprising forming a conductive gate surrounding sidewalls of the semiconductor fin.

7. The method of claim 5 further comprising forming a conductive gate contact on the conductive gate.

8. The method of claim 7, wherein forming the conductive gate contact on the conductive gate comprises etching through the dielectric material to form a second trench.

9. The method of claim 8, wherein forming the conductive gate contact on the conductive gate further comprises depositing the metal in the second trench.

10. The method of claim 9, wherein depositing the metal in the first trench is performed in a separate step from depositing the metal in the second trench.

11. The method of claim 10, wherein the conductive gate contact does not extend beyond the conductive gate in a direction of the channel of the semiconductor fin.

12. The method of claim 1, wherein the contact extension is not self-aligned with the extended contact.

13. The method of claim 1, wherein the first doped region has a thickness of less than about 30 nm in a direction of the channel of the semiconductor fin.

14. A method for fabricating a semiconductor device, the method comprising:
    forming an etch stop layer over a substrate;
    forming a semiconductor fin over the etch stop layer;
    forming a first doped region on a first end the semiconductor fin;
    forming a second doped region on a second end the semiconductor fin;
    forming an extended contact on the second doped region and contacting the etch stop layer;
    forming a contact extension on the extended contact and through the etch stop layer; and
    forming a contact on a first doped region.

15. The method of claim 14, wherein each of the extended contact, the contact on the first doped region, and the contact extension comprises metal.

16. The method of claim 14, wherein forming each of the contact on the first doped region and the contact extension comprises etching through a dielectric material.

17. The method of claim 15, wherein forming each of the contact on the first doped region and the contact extension further comprises etching through the etch stop material.

18. A semiconductor device comprising:
    a first end of a first doped region on a first end of the semiconductor fin;
    an etch stop layer on a second end of the first doped region;
    a second doped region on a second end of a semiconductor fin; and
    an extended contact on the second doped region and contacting the etch stop layer, wherein the extended contact comprises metal.

* * * * *